United States Patent

Phipps et al.

Patent Number: 5,266,831
Date of Patent: Nov. 30, 1993

[54] EDGE TERMINATION STRUCTURE

[75] Inventors: John P. Phipps, Phoenix; Stephen P. Robb, Tempe, both of Ariz.

[73] Assignee: Motorola, Inc., Schaumburg, Ill.

[21] Appl. No.: 790,795

[22] Filed: Nov. 12, 1991

[51] Int. Cl.⁵ .................. H01L 21/04; H01L 23/60
[52] U.S. Cl. .................................. 257/620; 257/494
[58] Field of Search ............... 257/483, 484, 490, 478, 257/452, 492, 493, 494–496, 497–504, 508, 509, 601, 605, 620, 409, 105, 127, 67, 173

[56] References Cited

U.S. PATENT DOCUMENTS

| | | | |
|---|---|---|---|
| 3,911,473 | 10/1975 | Nienhuis | 257/773 |
| 4,707,720 | 11/1987 | Shirai et al. | 257/339 |
| 4,760,434 | 7/1988 | Tsuzuki et al. | 257/49 |
| 4,810,664 | 3/1989 | Kamins et al. | 257/506 |
| 4,889,829 | 12/1989 | Kawai | 257/67 |
| 5,028,548 | 7/1991 | Nguyen | 257/409 |
| 5,136,348 | 8/1992 | Tsuzuki et al. | 257/653 |

*Primary Examiner*—Rolf Hille
*Assistant Examiner*—Alexander Oscar Williams
*Attorney, Agent, or Firm*—Harry A. Wolin

[57] ABSTRACT

A semiconductor structure having an edge termination feature wherein at least one guard ring is disposed in a substrate between a main device portion and the edge of the substrate. A dielectric layer is then disposed on the substrate and a plurality of diodes are disposed on the dielectric layer above the at least one guard ring. The at least one guard ring and the diodes are electrically coupled so that the potential of the guard rings may be fixed by the diodes and leakage is greatly reduced.

9 Claims, 1 Drawing Sheet

EDGE TERMINATION STRUCTURE

FIELD OF THE INVENTION

This invention relates, in general, to semiconductor devices and more particularly to an edge termination structure and method.

BACKGROUND OF THE INVENTION

Edge termination structures are well known in the semiconductor art and serve to achieve high breakdown voltages in planar device structures. Generally, edge termination schemes attempt to reduce the electric field at the edge of a device where the electric field might otherwise cause premature device breakdown due to junction curvature effects. Simply stated, edge termination structures serve to reduce current leakage and increase breakdown voltage in planar semiconductor devices.

One well known edge termination scheme employs "floating" guard rings. "Floating" guard rings are typically diffused or implanted rings disposed at the edge of a die about the periphery of a semiconductor device. These rings are not electrically fixed at any given potential and therefore "float". When a device is in operation, the rings attain a potential somewhere between zero and the drain voltage causing a depletion region to form around the "floating" guard rings. If successive rings are used, each ring extending from the main junction of a device to the outer edge of a die will be at a higher potential than the preceding ring. These guard rings spread the depletion region between themselves to reduce the electric field at the device surface.

In employing these "floating" guard rings, the spacing, width and doping of the rings are critical since they will determine the potential of the rings. If these parameters are chosen correctly, the depletion region at the edge of the device will be shaped in a fashion that decreases the electric field. Ideally, the electric field will be reduced to such an extent that breakdown will not occur at the edge of the device, but will occur in the interior of the device at the limit of the planar junction. If the spacing, width and doping of the rings are not chosen correctly, the device will exhibit severe leakage characteristics.

Typically, edge termination schemes employing "floating" guard rings utilize extremely high numbers of rings. This generally requires substantial amounts of real estate. Often, extra implants, diffusions and/or annealing steps are required. Finally, because these rings "float" and are not electrically tied to anything, they are extremely sensitive to surface contamination or charge. Disturbances on the surface may easily influence the potential of the guard rings.

Another well known edge termination scheme utilizes a highly resistive film such as alpha silicon or SIPOS at the edge of the device between the outer edge of the die and ground at the main junction. The resistive film is generally formed on a dielectric layer such as the field oxide. A small leakage current through the resistive film causes the potential to vary linearly from the die edge to the main junction. The fixed potential of the film causes the depletion region in the underlying silicon to spread out at the die edge thus reducing the electric field and increasing breakdown voltage. Deficiencies in the resistive film scheme are that it is extremely difficult to maintain film integrity and high resistance due to humidity and bias. Further, the high resistivity of the film can cause a large RC time constant between the film and the capacitance of the field oxide on which the film is disposed. This may cause premature breakdown during high speed switching.

Another edge termination scheme utilizes diodes disposed on the field oxide between the outer edge of the device and the main junction. These diodes span the entire perimeter of the die. The principle with the use of polysilicon diodes is basically the same as that of the resistive film, except that the high impedance of the diodes is obtained via reverse bias PN junctions instead of high ohmic resistance as with the high resistance film. The spreading of the potential at the die edge is achieved by placing several back-to-back diodes in series. The breakdown voltage of the diode chain is made higher than the breakdown voltage of the underlying junctions so that the diodes never avalanche, but only act to spread the depletion region at the edge of the device.

Because the diodes span the entire perimeter of the die, they require large amounts of real estate. For large area die, the individual diodes themselves become very large. The large diode size causes leakage at high temperatures to be a substantial concern. Finally, high voltage diodes are often necessary which add additional mask steps to the fabrication of the device.

Accordingly, it is highly desirable to have an edge termination scheme capable of reducing or eliminating the problems encountered in utilizing the prior art edge termination schemes.

SUMMARY OF THE INVENTION

A semiconductor structure comprises a substrate of a first conductivity type having a main device portion therein. At least one guard region of a second conductivity type is disposed in the substrate between the main device portion and an edge of the substrate. Preferably, the at least one guard region is one or more guard rings disposed about the main device portion. A dielectric layer is disposed on the substrate above the at least one guard region and a plurality of diodes, generally of alternating conductivity type, are disposed on the dielectric layer at least partially above the at least one guard region. The at least one guard region and the plurality of diodes are then electrically coupled. This allows the plurality of diodes to fix the potential of the at least one guard region.

DETAILED DESCRIPTION OF THE INVENTION

Figure 1:
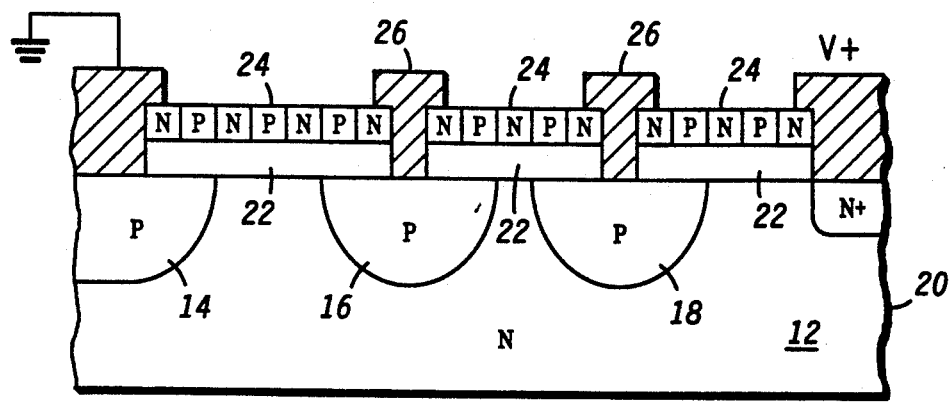
FIG. 1 is a highly enlarged cross-sectional view of a portion of a semiconductor structure having an edge termination feature.

FIG. 1 is a highly enlarged cross-sectional view of a portion of a semiconductor structure 10 having an edge termination feature. Structure 10 comprises a substrate 12. As shown herein, substrate 12 comprises silicon having an N conductivity type. The dopant concentration of substrate 12 may vary. It should be understood that although substrate 12 comprises N type silicon herein, other materials and/or conductivity types may be employed. A P type region 14 is formed in substrate 12. P type region 14 is an operational portion of a device such as a MOSFET, IGBT or MCT. Region 14 comprises a portion of a main device portion that is not completely depicted herein. These devices are well known in the art and their disclosure is not necessary to adequately explain the present invention.

A first guard ring 16 and a second guard ring 18, both of P conductivity type are disposed in substrate 12 between region 14 and edge 20 of substrate 12. As shown herein, guard rings 16 and 18 surround the periphery of the main device portion although other guard region configurations may be utilized. Guard rings 16 and 18 may be formed by diffusion, implant or other well known method. Preferably, guard rings 16 and 18 will have a dopant concentration on the order of $10^{17}$ to $10^{18}$ atoms/cc. Although two guard rings 16 and 18 are shown herein it should be understood that varying numbers of guard rings may be employed depending upon the desired application. Further, the spacing, size and doping of guard rings 16 and 18 are dependent upon specific applications. As will be explained presently, these parameters are not critical.

An oxide layer 22 is formed on the surface of substrate 12. Oxide layer 22 is a field oxide or the like as is well known in the art. A plurality of diodes 24 are formed on oxide layer 22 at least partially above guard rings 16 and 18. Diodes 24 as shown are of alternating conductivity type. Diodes 24 may be formed by forming a polysilicon layer on oxide layer 22 and then alternatively doping the polysilicon layer to form diodes 24. Preferably diodes 24 have a dopant concentration on the order of $10^{17}$ to $10^{18}$ atoms/cc and breakdown voltage on the order of 8 volts. The size and dopant concentration of diodes 24 may be varied and are dependent upon specific applications. Plurality of diodes 24 are coupled to guard rings 16 and 18 by coupling contacts 26. Coupling contacts 26 comprise one of many well known contact metals. It should also be understood that coupling contacts 26 may comprise conductive materials other than metal. Coupling contacts 26 extend from plurality of diodes 24 through oxide layer 22 and contact guard rings 16 and 18 at the surface of substrate 12. If additional guard rings are employed, additional coupling contacts 26 may also be employed to couple each guard ring to plurality of diodes 24. Contacts 26 are preferably formed simultaneously with other contacts on the main device portion so that additional process steps are not required for their fabrication.

The edge termination feature of the present invention allows reduction of the electric field by forcing the potential to vary between region 14 and edge 20 in an externally controlled manner. By coupling plurality of diodes 24 to guard rings 16 and 18, the potential of guard rings 16 and 18 is fixed by the potential of diodes 24 which is set externally. Accordingly, guard rings 16 and 18 are not "floating" and are not contamination or surface charge sensitive. Further, the spacing, size and doping of guard rings 16 and 18 are not critical since the potential of guard rings 16 and 18 is fixed by diodes 24.

The voltage drop between rings 16 and 18 is governed by the number diodes 24 disposed therebetween. Likewise, the voltage drop between region 14 and guard ring 16 is governed by the number of diodes 24 therebetween and the voltage drop between guard ring 18 and edge 20 is also governed by the number of diodes 24 therebetween. Accordingly, voltage drop may be increased or decreased depending upon the number of diodes 24 and also upon the size of diodes 24.

Figure 3:
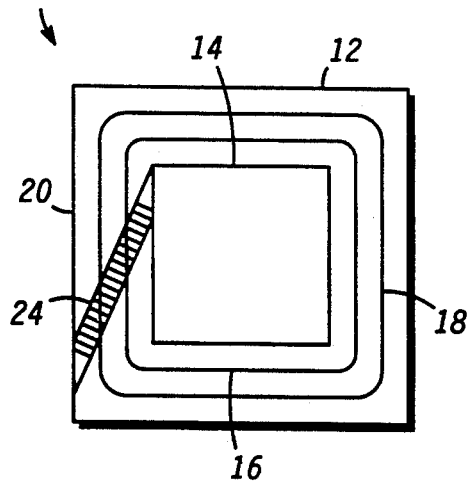
FIGS. 2-4 are simplified top views of a semiconductor structure in accordance with the present invention.
Figure 2:
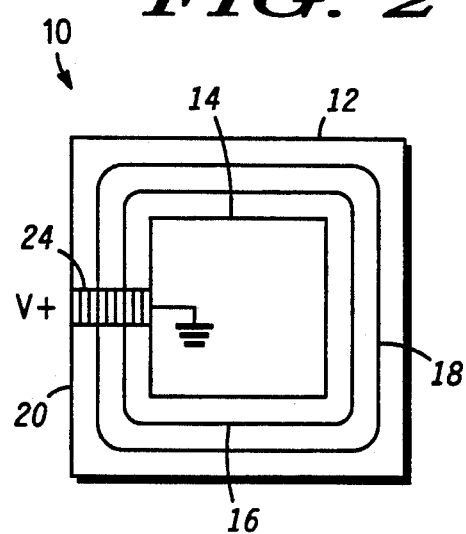
Figure 4:
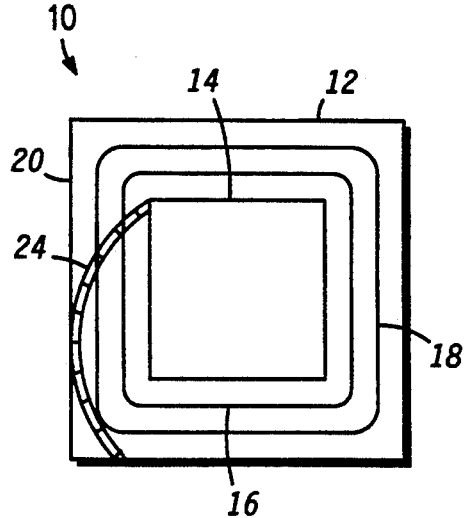

FIGS. 2–4 are simplified top views of semiconductor structure 10 in accordance with the present invention. Although the diode configurations of FIGS. 1–4 are different, like numbers will be used to signify those elements that are substantially similar.

FIG. 2 depicts a single strip of diodes 24 extending generally from region 14 over guard rings 16 and 18 to edge 20. FIG. 3 again depicts plurality of diodes 24 extending generally from region 14 over guard rings 16 and 18 to edge 20. Plurality of diodes 24 of FIG. 3 extend diagonally. This layout allows a greater number of diodes to be disposed on a die of a given size. FIG. 4 also depicts plurality of diodes 24 extending generally from region 14 over guard rings 16 and 18 to edge 20. In FIG. 4, plurality of diodes 24 spiral basically from region 14 to the edge of the substrate 12. It should be understood that it is possible to spiral plurality of diodes 24 about the main device portion more than once.

The various configurations of plurality of diodes 24 depicted in FIGS. 2–4 have substantial advantages over the prior art. Since diodes 24 are coupled to guard rings 16 and 18, a single strip of diodes may be used to control the potential of rings 16 and 18 as opposed to diodes being disposed completely about the periphery of the main device portion. The single strip is relatively narrow and therefore, has significantly small leakage problems. Since only a single strip of diodes 24 is employed, large numbers of diodes 24 may be employed without utilizing significant amounts of real estate. The increased number of diodes allow for lesser voltage diodes to be employed. There is a great advantage derived from using lesser voltage diodes in that the potential variation occurs in small steps which makes it much easier to fix the potential of any given guard ring at or near the desired value. For example, a 1300 volt string of diodes would require that 163 diodes each having a breakdown voltage of 8 volts be employed. If each diode is 10 micrometers long, the diode strip would be 64 mils long. This strip would easily fit on the vast majority of die without requiring additional real estate.

It is very easy to control the resistance and breakdown voltage of the diodes because of their doping on the order of $10^{17}$–$10^{18}$ atoms/cc. Because the voltage steps are smaller, it is also reasonable to apply this edge termination feature to smaller voltage devices. Although edge termination schemes are generally utilized in high voltage devices, the edge termination feature disclosed herein may readily be used with devices having voltages of 200 volts and less because of the smaller voltage steps.

Thus it is apparent that there has been provided, in accordance with the invention, an improved edge termination structure and method. While specific embodiments of the invention have been shown and described, further modifications and improvements will occur to those skilled in the art. It is desired that it be understood, therefore, that this invention is not limited to the particular forms shown and it is intended in the appended claim to cover all modifications which do not depart from the spirit and scope of this invention.

What is claimed is:

1. A semiconductor structure comprising:
a semiconductor substrate of a first conductivity type having a main device portion therein;
at least one guard region of a second conductivity type disposed in said substrate between said main device portion and an edge of said substrate wherein the at least one guard region comprises a guard ring disposed about said main device portion;

a dielectric layer disposed on said substrate above said at least one guard region;

a plurality of diodes disposed on said dielectric layer at least partially above said at least one guard region; and coupling means electrically coupling said at least one guard region and said plurality of diodes.

2. The structure of claim 1 wherein the at least one guard region comprises a plurality of guard rings disposed about the main device portion.

3. The structure of claim 2 wherein each guard ring is electrically coupled to the plurality of diodes by coupling means.

4. The structure of claim 1 wherein the coupling means comprise metal extending from the plurality of diodes, through the dielectric layer and contacting the at least one guard region.

5. The structure of claim 1 wherein the potential of the at least one guard region is fixed by the plurality of diodes.

6. A semiconductor structure having an edge termination feature comprising:

a silicon substrate of a first conductivity type having a main device portion therein;

at least one guard ring of a second conductivity type disposed in said substrate about said main device portion;

an oxide layer disposed on said substrate above said at least one guard ring;

a plurality of diodes of alternating conductivity type disposed on said dielectric layer at least partially above said at least one guard ring; and at least one coupling contact, contacting at least one of said plurality of diodes, extending through said oxide layer and contacting said at least one guard ring thereby electrically coupling said at least one guard ring and said plurality of diodes.

7. The structure of claim 6 wherein the at least one guard ring comprises a plurality of guard rings, each of said guard rings being electrically coupled to the plurality of diodes by at least one coupling contact.

8. The structure of claim 7 wherein each coupling contact comprises metal.

9. The structure of claim 8 wherein the potential of the plurality of guard rings is fixed by the plurality of diodes.

* * * * *